United States Patent
Kolakovic et al.

(10) Patent No.: US 7,940,124 B2
(45) Date of Patent: May 10, 2011

(54) BI-DIRECTIONAL AND ADJUSTABLE CURRENT SOURCE

(75) Inventors: Mirza Kolakovic, Livonia, MI (US);
Greg Hamel, Livonia, MI (US);
Matthew Day, Commerce Township, MI (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 12/391,133

(22) Filed: Feb. 23, 2009

(65) Prior Publication Data
US 2010/0214022 A1    Aug. 26, 2010

(51) Int. Cl.
*H03F 3/04*    (2006.01)
(52) U.S. Cl. .................. 330/296; 330/302; 330/273
(58) Field of Classification Search .................. 330/296, 330/302, 273
See application file for complete search history.

(56) References Cited

U.S. PATENT DOCUMENTS

| | | | | |
|---|---|---|---|---|
| 3,942,041 A | * | 3/1976 | Morriss | 327/129 |
| 4,266,275 A | * | 5/1981 | Marchak | 701/110 |
| 4,335,361 A | * | 6/1982 | Acker | 330/285 |
| 5,349,311 A | * | 9/1994 | Mentzer | 331/57 |
| 5,939,938 A | | 8/1999 | Kalb et al. | |
| 6,041,416 A | | 3/2000 | Lada, Jr. | |
| 7,068,200 B1 | | 6/2006 | Hodapp et al. | |
| 7,076,384 B1 | * | 7/2006 | Radulov et al. | 702/85 |
| 7,315,160 B2 | * | 1/2008 | Fosler | 323/285 |
| 2005/0140432 A1 | | 6/2005 | Nair et al. | |
| 2007/0040471 A1 | * | 2/2007 | Ollila | 310/317 |
| 2008/0054993 A1 | | 3/2008 | Rashid | |
| 2008/0204133 A1 | | 8/2008 | Fontaine et al. | |

OTHER PUBLICATIONS

Dufresne, Daniel; Scheme Yields Frequency-Locked Triangle Waves; EDN Design Ideas; Feb. 2, 1998.

* cited by examiner

*Primary Examiner* — Patricia Nguyen
(74) *Attorney, Agent, or Firm* — The Eclipse Group LLP

(57) ABSTRACT

A Bi-Directional and Adjustable Current Source ("BACS") for providing an amplifier input with a voltage signal that is linear, where an output of the BACS and the amplifier input are shunted with a capacitor, is described. The BACS may include a first switch in signal communication with a high voltage reference and a first current source in signal communication with the first switch. The BACS may also include a second switch in signal communication with a low voltage reference and a second current source in signal communication with the second switch. The BACS may further include a directional current element in signal communication with both the first current source, the second current source, the output of the BACS, the amplifier input, and the capacitor, where the directional current element is configured to prevent current flow from the output BACS to the first current source.

19 Claims, 3 Drawing Sheets

BI-DIRECTIONAL AND ADJUSTABLE CURRENT SOURCE

BACKGROUND OF THE INVENTION

1. Field of the Invention

This invention relates, in general, to electronic circuits and, in particular, to electronic circuits that control abrupt transients during amplifier power-up and power-down operations.

2. Related Art

In conventional amplifiers, electronic operations that either power-up or power-down an amplifier may cause abrupt transients that surge the output of the amplifier causing unpleasant audible noises (commonly referred to as a "pops") when the output of the amplifier is utilized to drive a coupled load (such as, for example, an audio speaker or headset). Unfortunately, this situation is a problem because not only are these "pops" unpleasant to a listener but they may also damage the coupled load because the abrupt transients may surge the output of the amplifier to a power level capable of damaging either the audio speakers or headset.

In an automotive environment, as an example, this problem is difficult to solve due to multiple factors such as: a varying system voltage; a sound proofed quiet cabin; and listeners located in close proximity to multiple, highly sensitive speakers. Unfortunately, known techniques for attempting to solve this problem adversely affect other aspects of the system.

As an example, a conventional attempt to partially solve this problem has been to improve the transients by correspondingly attempting to improve the transition performance of the amplifier by gradually powering down the power state of the amplifier in a controlled manner. Typically, this is done by utilizing an RC circuit that provides an exponential voltage curve to the amplifier in order to control the power-down and power-up operations of the amplifier. Unfortunately, this exponential voltage curve is non-linear and, therefore, the resulting powering-down and powering-up times of the amplifier are different.

As a result, there is a need for a new circuit and method capable of controlling the resulting abrupt transients caused by either powering up or powering down an amplifier without utilizing a circuit that provides the amplifier with a voltage signal that is characterized by a non-linear voltage curve.

SUMMARY

A Bi-Directional and Adjustable Current Source ("BACS") for providing an amplifier input with a voltage signal that is linear, where an output of the BACS and the amplifier input are shunted with a capacitor, is described. The BACS may include a first switch in signal communication with a high voltage reference and a first current source in signal communication with the first switch. The BACS may also include a second switch in signal communication with a low voltage reference and a second current source in signal communication with the second switch. The BACS may further include a directional current element in signal communication with both the first current source, the second current source, the output of the BACS, the amplifier input, and the capacitor, where the directional current element is configured to prevent current flow from the output BACS to the first current source.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

A Bi-Directional and Adjustable Current Source ("BACS") for providing an amplifier with a voltage signal that is linear is described. In general, the BACS operates by controlling the current that charges a capacitor that is shunted on the output of the BACS so as to provide a linear voltage with a constant slope (referred to as a "voltage ramp") at the output of the BACS. The output of the BACS is in signal communication with the input to the amplifier. The BACS produces linear charging and discharging voltage ramps and may produce equal charging and discharging times in the power-down and power-up operations.

Figure 1:
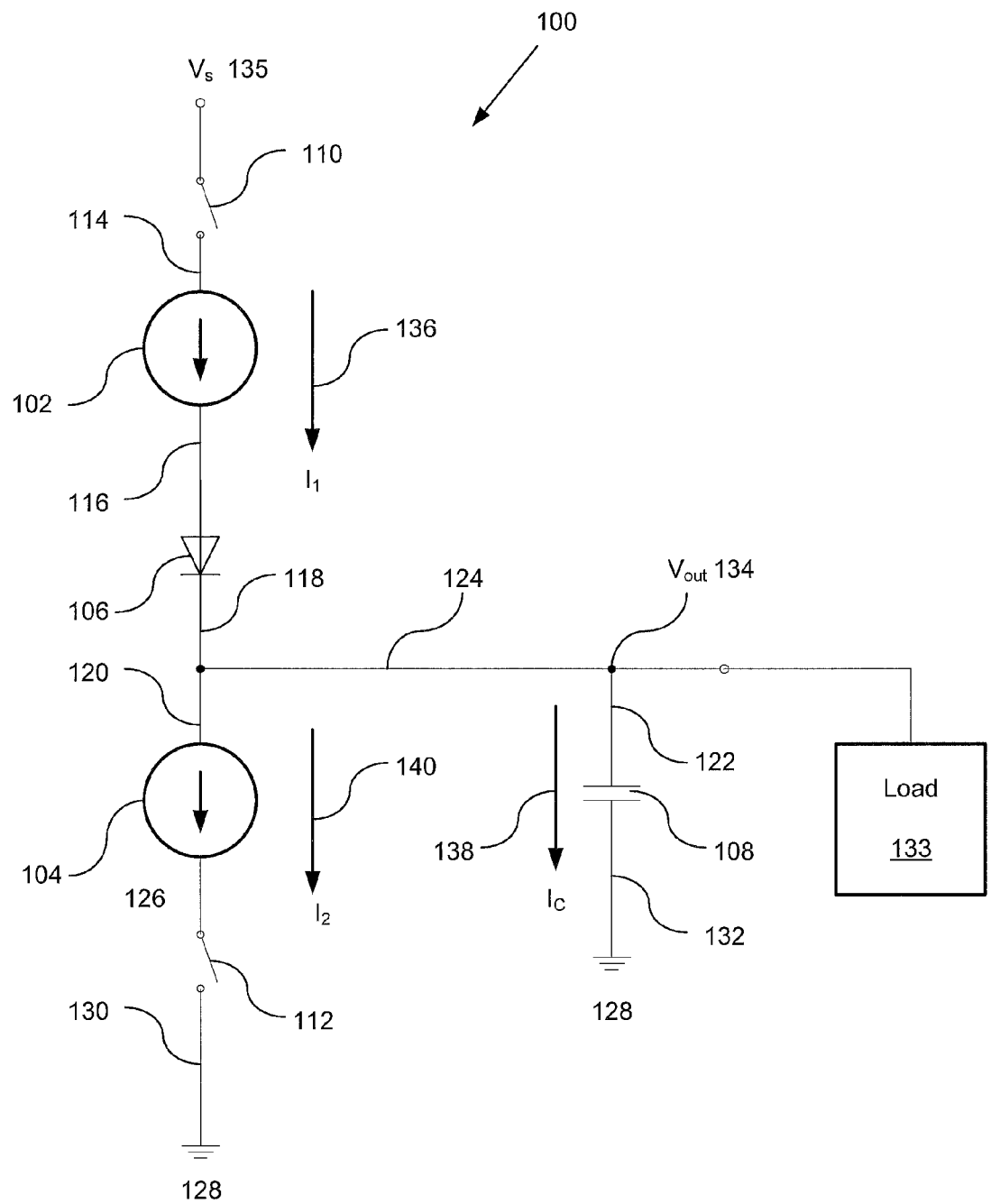
FIG. 1 is a circuit diagram showing an example of an implementation of a Bi-Directional and Adjustable Current Source ("BACS").

In FIG. 1, a circuit diagram of an example of an implementation of a BACS 100 is shown. The BACS 100 may include a first current source 102, second current source 104, directional current element 106, capacitor C 108 (referred to as a "ramp capacitor"), first switch 110, and second switch 112. As an example, the first switch 110 may be in signal communication the first current source 102 via signal path 114. The directional current element 106 may be in signal communication with the first current source 102, second current source 104, and capacitor 108 via signal paths 116, 118, 120, and 122, respectively, where signal paths 118, 120, and 122 are in signal communication via a signal node 124. The second current source 104 may be in signal communication with the second switch 112 via signal path 126. The second switch 112 and ramp capacitor 108 may be in signal communication with low-voltage reference (for example, a zero-potential voltage reference such as ground) 128 via signal paths 130 and 132, respectively. The BACS 100 may also be in signal communication with a coupled load 133, which may be, for example, an amplifier, at signal node 124.

As an example, the directional current element 106 may be a diode. The ramp capacitor 108 may be an on-chip capacitor or an off-chip capacitor and may be formed of one or plural capacitors. The ramp capacitor 108 may have a constant capacitance value or a varying capacitance value. A varying capacitance value of the ramp capacitor 108 may be obtained by any method of varying a capacitance of a capacitor including, but not limited to, when the ramp capacitor 108 is an off-chip capacitor, setting the capacitance of the ramp capacitor 108 at a selected value by choosing the off-chip capacitor with an appropriate capacitance value and, when the ramp capacitor 108 is formed of plural capacitors coupled via switches, varying the capacitance of the ramp capacitor 108 by opening and closing switches between the capacitors to achieve a desired combinative capacitance value.

It is appreciated by those skilled in the art that the circuits, components, modules, and/or devices of the BACS 100 are described as being in signal communication with each other, where signal communication refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical such as, for example, conductive wires, electromagnetic wave guides, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats without passing through a direct electromagnetic connection.

In an example of operation, the BACS 100 may perform as a voltage regulator that produces an output voltage $V_{out}$ 134 that has a linear voltage ramp that is caused by a constant current charging the ramp capacitor 108 at the signal node 124. The output voltage $V_{out}$ 134 may be used to drive the input of the load 133 that is in signal communication with the signal node 124. By utilizing the linear voltage ramp of output voltage $V_{out}$ 134, which may be ramped up or down at a controlled rate of change, an output (not shown) of the load may have little or no abrupt transient voltage signal components.

In this example, the first switch 110 may be in signal communication with a high-voltage reference $V_S$ 135 (such as, for example, a source voltage). The capacitance of the ramp capacitor 108 may be varied before or during an operation of the BACS 100, which allows the rate of change in the capacitor voltage (also known as the ramp voltage, which is equal to the output voltage $V_{out}$ 134) to be varied before or during the operation of the BACS 100 while the capacitor voltage $V_{out}$ 134 is being ramped up or ramped down.

As an example of operation, the BACS 100 is configured to operate in two modes that are the charge-mode and discharge-mode. If either the first switch 110 or second switch 112 is closed, the resulting output voltage $V_{out}$ 134 at the signal node 124 may be ramped up or down at a constant or varying voltage change rate.

In the charge-mode, the first switch 110 is closed, the second switch 112 is open, and the first current source 102 produces the charge current $I_1$ 136 that flows through the directional current element 106 to the signal node 124. Most of the charge current $I_1$ 136 then flows through the capacitor 108 as a capacitor current $I_C$ 138. The capacitor current $I_C$ 138 charges the capacitor 108 and produces the ramp voltage $V_{cp}$ 136 across the capacitor 108 where the ramp voltage $V_{cp}$ 136 is equal to the output voltage signal $V_{out}$ 134.

In the charge-mode, if, for example, the first current source 102 is on, the first switch 110 is closed, and the second switch 112 is open, the first current source 102 produces a constant charge current $I_1$ 136 that flows through the directional current element 106 into signal node 124 and charges the ramp capacitor 108 as ramp current $I_C$ 138. In this example, the ramp current $I_C$ 138 is equal to the constant charge current $I_1$ 136 because no current flows through the second current source 104 because the open second switch 112 operates as an electrical open circuit that does not allow current to flow from the second current source 104.

In this example, assuming the low-voltage reference 128 is an electrical ground having a potential voltage of zero, the value of the ramp voltage $V_{out}$ 134 at signal node 124, as a function of time, is described by the following equation:

$$V_{out}(t) = \frac{1}{C}\int I_C(t)dt$$

where $I_C(t)$ is the ramp current $I_C$ 138 as a function of time "t" and C is the capacitance value of the ramp capacitor 108. Since the ramp current $I_C$ 138 has a constant value because it is equal to the constant charge current $I_1$ 136, the above equation simplifies to $$V_{out}(t) = \frac{I_C t}{C} = \frac{I_1 t}{C}.$$

As such, the ramp voltage $V_{out}$ 134, as a function of time when charging the ramp capacitor 108, is a linear response that ramps up versus time when the first switch 110 is closed, the first current source 102 is on, and the second switch 112 is open.

Alternatively, in the discharge-mode, if, for example, the second current source 104 is on, the first switch 110 is open, and the second switch 112 is closed, the second current source 104 operates as a current sink producing a constant discharge current $I_2$ 140 that flows from the signal node 124 to the low-voltage reference 128. In this example, the ramp capacitor 108 discharges and produces ramp current $I_C$ 138 that flows from the ramp capacitor 108 to the signal node 124. The ramp current $I_C$ 138 is equal to the constant discharge current $I_2$ 140 because no current flows through the directional current element 106 because it only allows current flow in the opposite direction. Additionally, even if some discharge current were capable of flowing in the opposite direction of the directional element 106, the first switch 110 would not allow current flow through the first current source 102 because the open first switch 110 operates as an electrical open circuit that does not allow current to flow from the first current source 102. Therefore, in this example, the ramp current $I_C$ 138 is equal to the constant discharge current $I_2$ 140.

Again, assuming the low-voltage reference 128 is an electrical ground having a potential voltage of zero, the value of the ramp voltage $V_{out}$ 134 at signal node 124, as a function of time, is described by the following equation:

$$V_{out}(t) = \frac{1}{C}\int I_C(t)dt.$$

Since the ramp current $I_C$ 138 has a constant value because it is equal to the constant discharge current $I_2$ 140, the above equation simplifies to $$V_{out}(t) = \frac{I_C t}{C} = \frac{I_1 t}{C}.$$

As such, the ramp voltage $V_{out}$ 134, as a function of time when discharging the ramp capacitor 108, is a linear response that ramps down versus time when the first switch 110 is open, the second current source 104 is on, and the second switch 112 is closed.

The output voltage signal $V_{out}$ 134 may be utilized by the load 133 to generate a load output (not shown). By utilizing the ramp voltage $V_{out}$ 134 (which may be ramped-up or down at a controlled rate of change), the load output may produce an output signal (not shown) that has small or even non-existent abrupt transient voltage signal components. Because the constant currents $I_1$ 136 and $I_2$ 140 may be either equal or different, the rate of a change in the magnitude of the ramp voltage $V_{out}$ 134 will be constant while it is being ramped up or down.

Figure 2:
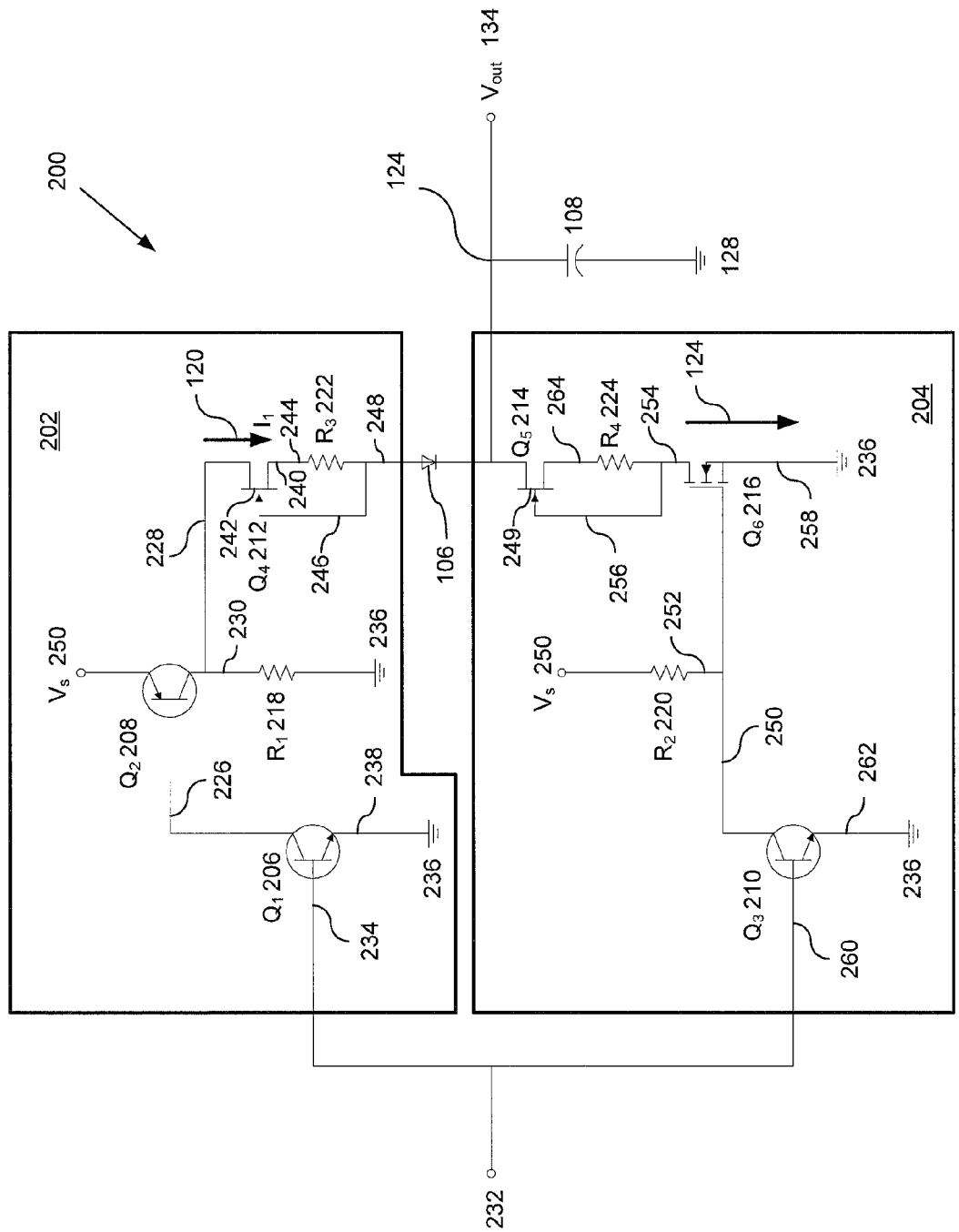
FIG. 2 is a circuit diagram showing an example of an implementation of the BACS shown in FIG. 1 utilizing both bipolar junction and field effect transistors.

In FIG. 2, a circuit diagram of an example of an implementation of the BACS 200 utilizing both bipolar junction ("BJT") and field effect transistors ("FETs") is shown. In this example, the BACS 200 may include the directional current element 106, a current driver section 202, and current sink section 204. The current driver section 202 may be an example of an architectural implementation of the first switch 110 and first current source shown 102 shown in FIG. 1. Similarly, the current sink section 204 may be an example of an architectural implementation of the second switch 112 and second current source shown 104 shown in FIG. 1. The BACS 200 may include transistors $Q_1$ 206, $Q_2$ 208, $Q_3$ 210, $Q_4$ 212, $Q_5$ 214, and $Q_6$ 216; and resistors $R_1$ 218, $R_2$ 220, $R_3$ 222 and $R_4$ 224.

In this example, the current driver section 202 may include BJT transistors $Q_1$ 206 and $Q_2$ 208, FET transistor $Q_4$ 212, and resistors $R_1$ 218 and $R_3$ 222. The transistor $Q_2$ 208 may be in signal communication with transistors $Q_1$ 206 and $Q_4$ 212 and resistor $R_1$ 218 via signal paths 226, 228, and 230, respectively. The transistor $Q_1$ 206 is in signal communication with a Mute_Control input 232 and ground 236 via signal paths 234 and 238 and resistor $R_1$ 218 is in signal communication with ground 236. Resistor $R_3$ 222 is in signal communication with the drain 240 and gate 242 of FET transistor $Q_4$ 212 and directional current element 106 via signal paths 244, 246, and 248, respectively. The transistor $Q_2$ 208 may receive a source voltage $V_S$ 250, where the source voltage $V_S$ 250 may be equal to the high-voltage reference $V_S$ 135 shown in FIG. 1.

Similarly, the current sink section 204 may include BJT transistor $Q_3$ 210, FET transistors $Q_5$ 214 and $Q_6$ 216, and resistors $R_2$ 220 and $R_4$ 224. FET transistor $Q_6$ 216 may be in signal communication with BJT transistor $Q_3$ 210, gate 249 of FET transistor $Q_5$ 214, resistors $R_2$ 220 and $R_4$ 224, and ground 236 via signal paths 250, 256, 252, 254, and 258, respectively. The transistor $Q_3$ 210 is also in signal communication with the Mute_Control input 232 and ground 236 via signal paths 260 and 262, respectively. FET transistor $Q_5$ 214 may be in signal communication with resistor $R_4$ 224 via signal path 264. Additionally, FET transistor $Q_5$ 214 may be in signal communication with the directional current element 106 and ramp capacitor 108 via signal node 124. The resistor $R_2$ 220 may also receive the source voltage $V_S$ 250, where the source voltage $V_S$ 250 may be equal to the high-voltage reference $V_S$ 135 shown in FIG. 1.

In the charging mode, transistors $Q_1$ 206, $Q_2$ 208, and $Q_4$ 212 control the charging of the ramp capacitor C1 108. When a Mute_Control 232 input is a logic "HI" (i.e., it powers up both $Q_1$ 206 and $Q_3$ 210), both transistors $Q_1$ 206 and $Q_3$ 210 turn on. Transistor $Q_3$ 210 holds off transistor $Q_6$ 216, so it conducts no current. Transistor $Q_1$ 206 turns on transistor $Q_2$ 208, which starts sinking current into transistor $Q_4$ 212 and resistor $R_1$ 218. The gate 242 of FET transistor $Q_4$ is wired such that the current flow through $Q_4$ 212 is controlled by the value of resistor $R_3$ 222. Varying the value of $R_3$ 222 will vary the gate-to-source voltage ("$V_{gs}$") of FET transistor $Q_4$ 212 which sets the bias point. The constant charging current $I_1$ 120 flows through the directional current element 106 and charges the ramp capacitor 108, providing a linear voltage increase of $V_{out}$ 134 over time at signal node 124.

Alternatively, in the discharging mode, when Mute_Control 232 is a logic "LOW" (i.e., it does not power up both $Q_1$ 206 and $Q_3$ 210), both transistors $Q_1$ 206 and $Q_3$ 210 are turned off. Transistor $Q_6$ 216 is turned on by the pull-up resistor $R_2$ 220, which starts sinking current out of transistor $Q_5$ 214 through $R_4$. Similarly to the case above, the gate 249 of FET transistor $Q_5$ 214 is wired such that the current flow through FET transistor $Q_5$ 214 is controlled by the value of resistor $R_4$ 224. The constant discharging current $I_2$ 124 flows through $Q_5$ 214 and $Q_6$ 216 discharging the ramp capacitor 108. This process provides a linear voltage decrease of $V_{out}$ 134 over time at the signal node 124. In this example of an implementation, transistors $Q_4$ 212 and $Q_5$ 214 should ideally be the same, while $R_4$ 224, $R_3$ 222, and ramp capacitor 108 may be adjusted independently to set the slope of the time varying voltage ramp of $V_{out}$ 134 at the signal node 124.

Figure 3:
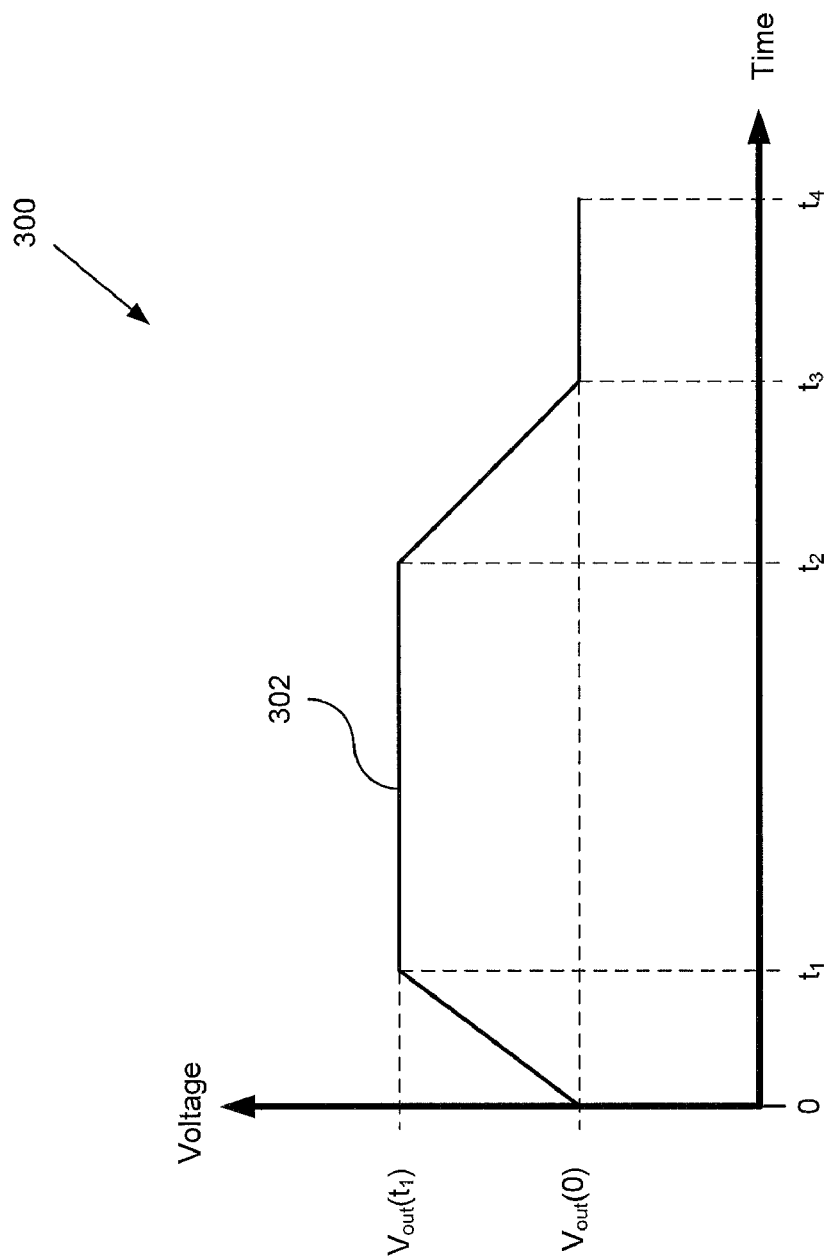
FIG. 3 is a plot of voltage versus time for the BACS.

FIG. 3 is a plot 300 of an example of a voltage curve 302 of the ramp voltage $V_{out}$ 134 as function of time. In this example, from time t equals 0 to time $t_1$, the BACS 200 charges the ramp capacitor 108 and the voltage curve 302 shows a constant positive slope that rises from $V_{out}$ (0) to $V_{out}$ ($t_1$). From time t equals $t_1$ to time $t_2$, the ramp capacitor 108 is fully charged and the voltage curve 302 shows a constant voltage of $V_{out}$ ($t_1$). From time t equals $t_2$ to time $t_3$, the BACS 200 discharges the ramp capacitor 108 and the voltage curve 302 shows a constant negative slope that drops from $V_{out}$ ($t_1$) to $V_{out}$ (0). Lastly, from time t equals $t_3$ to time $t_4$, the ramp capacitor 108 is fully discharged and the voltage curve 302 shows a constant voltage of $V_{out}$ (0).

While various embodiments of the invention have been described, it will be apparent to those of ordinary skill in the art that many more embodiments and implementations are possible that are within the scope of this invention.

What is claimed is:

1. A Bi-Directional and Adjustable Current Source ("BACS") for providing an amplifier input with a voltage signal that is linear, where an output of the BACS and the amplifier input are shunted with a capacitor, the BACS comprising:
    a first switch in signal communication with a high-voltage reference;
    a first current source in signal communication with the first switch;
    a second switch in signal communication with a low-voltage reference;
    a second current source in signal communication with the second switch; and
    a directional current element in signal communication with both the first current source, the second current source, the output of the BACS, the amplifier input, and the capacitor, wherein the directional current element is configured to prevent current flow from the output BACS to the first current source.

2. The BACS of claim 1, wherein the directional current element is a diode.

3. The BACS of claim 1, wherein the first switch includes a transistor configured to act as a switching element.

4. The BACS of claim 3, wherein the first current source includes a transistor configured to act as a current regulator.

5. The BACS of claim 1, wherein the second switch includes a transistor configured to act as a switching element.

6. The BACS of claim 5, wherein the second current source includes a transistor configured to act as a current regulator.

7. A method for providing an amplifier input with a voltage signal that is linear utilizing a Bi-Directional and Adjustable Current Source ("BACS") and a shunt capacitor, the method comprising:
   generating a first linear voltage signal when the shunt capacitor is charging; and
   generating a second linear voltage signal when the shunt capacitor is discharging.

8. The method of claim 7, wherein generating a first linear voltage signal includes providing a charge current from a first current source to the shunt capacitor via a directional current element.

9. The method of claim 8, wherein generating a first linear voltage signal includes utilizing a diode as the directional current element.

10. The method of claim 9, wherein generating a first linear voltage signal includes closing a first switching element in signal communication with the first current source.

11. The method of claim 7, wherein generating a second linear voltage signal includes sinking a discharge current from the shunt capacitor to a second current.

12. The method of claim 11, wherein generating a second linear voltage signal includes closing a second switching element in signal communication with the second current source.

13. A Bi-Directional and Adjustable Current Source ("BACS") for providing an amplifier input with a voltage signal that is linear, where an output of the BACS and the amplifier input are shunted with a capacitor, the BACS comprising:
   means for generating a first linear voltage signal when the shunt capacitor is charging; and
   means for generating a second linear voltage signal when the shunt capacitor is discharging.

14. The BACS of claim 13, wherein the means for generating a second linear voltage signal when the shunt capacitor is discharging includes:
   a second switch in signal communication with a low-voltage reference;
   a second current source in signal communication with the second switch; and,
wherein means for generating a first linear voltage signal includes:
   a first switch in signal communication with a high-voltage reference;
   a first current source in signal communication with the first switch; and
   a directional current element in signal communication with both the first current source, the second current source, the output of the BACS, the amplifier input, and the capacitor, wherein the directional current element is configured to prevent current flow from the output BACS to the first current source.

15. The BACS of claim 14, wherein the directional current element is a diode.

16. The BACS of claim 14, wherein the first switch includes a transistor configured to act as a switching element.

17. The BACS of claim 16, wherein the first current source includes a transistor configured to act as a current regulator.

18. The BACS of claim 14, wherein the second switch includes a transistor configured to act as a switching element.

19. The BACS of claim 18, wherein the second current source includes a transistor configured to act as a current regulator.

* * * * *